United States Patent
Lee et al.

(10) Patent No.: US 11,296,221 B2
(45) Date of Patent: Apr. 5, 2022

(54) POWER SEMICONDUCTOR DEVICE

(71) Applicant: HYUNDAI MOBIS CO., LTD., Seoul (KR)

(72) Inventors: Ju-Hwan Lee, Seongnam-si (KR);
Tae-Young Park, Gunpo-si (KR);
Seong-hwan Yun, Seoul (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 16/862,949

(22) Filed: Apr. 30, 2020

(65) Prior Publication Data

US 2020/0357919 A1    Nov. 12, 2020

(30) Foreign Application Priority Data

May 8, 2019 (KR) .................. 10-2019-0053685

(51) Int. Cl.
*H01L 29/78* (2006.01)
*H01L 29/10* (2006.01)

(52) U.S. Cl.
CPC ...... *H01L 29/7815* (2013.01); *H01L 29/1079* (2013.01); *H01L 29/1095* (2013.01)

(58) Field of Classification Search
CPC ............ H01L 29/7815; H01L 29/1079; H01L 29/1095; H01L 27/0248; H01L 29/7813; H01L 29/0696; H01L 29/0619; H01L 29/7397; H01L 27/0823; H01L 29/7393; H01L 29/66325; H01L 21/823493; H01L 21/823418; H01L 21/32055; H01L 22/14
USPC ....................................................... 257/330
See application file for complete search history.

(56) References Cited

U.S. PATENT DOCUMENTS

| | | | | |
|---|---|---|---|---|
| 5,491,357 A | * | 2/1996 | Zambrano | ........... H01L 27/0248 257/154 |
| 5,691,555 A | * | 11/1997 | Zambrano | ........... H01L 29/7815 257/332 |
| 5,729,032 A | * | 3/1998 | Tomomatsu | ........ H01L 27/0248 257/139 |

(Continued)

FOREIGN PATENT DOCUMENTS

| | | |
|---|---|---|
| JP | H06-120495 A | 4/1994 |
| JP | 2018-063993 A | 4/2018 |

(Continued)

OTHER PUBLICATIONS

Korean Office Action dated May 21, 2020 from the corresponding Korean Application No. 10-2019-0053685, 6 pp.

*Primary Examiner* — Sheikh Maruf
(74) *Attorney, Agent, or Firm* — Morgan, Lewis & Bockius LLP (57) ABSTRACT

A power semiconductor device includes: a semiconductor layer including a main cell region, a sensor region, and an insulation region between the main cell region and the sensor region; a plurality of power semiconductor transistors disposed on the main cell region; a plurality of current sensor transistors disposed on the sensor region; and a protection resistance layer disposed on the semiconductor layer across the insulation region so that at least a portion of the plurality of power semiconductor transistors and at least a portion of the plurality of current sensor transistors are connected to each other under an abnormal operation condition.

10 Claims, 8 Drawing Sheets

(56) References Cited

U.S. PATENT DOCUMENTS

| | | | | |
|---|---|---|---|---|
| 6,180,966 | B1* | 1/2001 | Kohno | H01L 29/7397 |
| | | | | 257/173 |
| 6,194,884 | B1* | 2/2001 | Kesler | G05F 3/222 |
| | | | | 323/285 |
| 2013/0146971 | A1* | 6/2013 | Hirler | H01L 29/7813 |
| | | | | 257/334 |
| 2013/0168730 | A1* | 7/2013 | Ashida | H01L 29/7394 |
| | | | | 257/139 |
| 2015/0042177 | A1* | 2/2015 | Weyers | H01L 29/7802 |
| | | | | 307/115 |
| 2015/0171070 | A1* | 6/2015 | Hanaoka | H03K 17/687 |
| | | | | 327/109 |
| 2015/0270387 | A1* | 9/2015 | Kumada | H01L 29/7397 |
| | | | | 257/140 |
| 2017/0069620 | A1* | 3/2017 | Tu | H01L 27/0262 |
| 2017/0139515 | A1* | 5/2017 | Lee | G02F 1/13338 |
| 2018/0102308 | A1* | 4/2018 | Nishiwaki | H01L 23/49548 |
| 2018/0269311 | A1* | 9/2018 | Liu | H01L 29/7802 |
| 2019/0123195 | A1* | 4/2019 | Suekawa | H01L 27/0251 |
| 2021/0082912 | A1* | 3/2021 | Shirakawa | H01L 29/0696 |
| 2021/0143251 | A1* | 5/2021 | Matsuda | H01L 21/02565 |

FOREIGN PATENT DOCUMENTS

| | | |
|---|---|---|
| KR | 10-0175402 B1 | 2/1999 |
| KR | 10-2014-0057630 A | 5/2014 |

\* cited by examiner

POWER SEMICONDUCTOR DEVICE

CROSS-REFERENCE TO RELATED APPLICATION

This application claims priority to and the benefit of Korean Patent Application No. 10-2019-0053685, filed on May 8, 2019, the entire contents of which are hereby incorporated by reference.

FIELD

The present disclosure relates to a semiconductor apparatus, and more particularly, to a power semiconductor device for switching power transmission.

BACKGROUND

The statements in this section merely provide background information related to the present disclosure and may not constitute prior art.

A power semiconductor device is a semiconductor device operating under a high voltage and high current condition. The power semiconductor device has been used in a field desiring high power switching, e.g., an inverter device. For example, an insulated gate bipolar transistor (IGBT) and a power MOSFET may be representative examples of the power semiconductor device. The power semiconductor device basically desires a withstand voltage property against a high voltage and additionally desires a high speed switching operation in recent years. However, although on-resistance is necessarily reduced for the high speed operation, the withstand voltage property may be reduced in this case.

The power semiconductor device monitors a current of a main operation cell by forming a current sensor cell in a sensor region with a predetermined mirroring ratio in comparison with the main operation cell in order to monitor an operation current. However, we have discovered that since the current sensor cell has an area that is extremely smaller than the main operation cell, an appropriate ESD capacitance may be hardly secured in the sensor region.

SUMMARY

The present disclosure provides a power semiconductor device capable of improving a capacitance characteristic of a sensor region. However, this is merely illustrative, and thus forms of present disclosure are not limited thereto.

In one form of the present disclosure, a power semiconductor device includes: a semiconductor layer including a main cell region, a sensor region, and an insulation region between the main cell region and the sensor region; a plurality of power semiconductor transistors disposed on the main cell region; a plurality of current sensor transistors disposed on the sensor region; and a protection resistance layer disposed on the semiconductor layer across the insulation region so that at least a portion of the plurality of power semiconductor transistors and at least a portion of the plurality of current sensor transistors are connected to each other under an abnormal operation condition.

In the power semiconductor device, the protection resistance layer may be connected to each of a well region of at least a portion of the plurality of power semiconductor transistors and a well region of at least a portion of the plurality of current sensor transistors. Furthermore, the protection resistance layer may include a polysilicon layer having an adjusted doping concentration.

In the power semiconductor device, at least a portion of the plurality of power semiconductor transistors and at least a portion of the plurality of current sensor transistors may share a gate capacitance.

In the power semiconductor device, the at least a portion of the plurality of power semiconductor transistors and the at least a portion of the plurality of current sensor transistors may share a gate electrode.

In the power semiconductor device, a gate electrode of the plurality of power semiconductor transistors and a gate electrode of the plurality of current sensor transistors may be arranged in a stripe type, and a gate electrode of the plurality of power semiconductor transistors and a gate electrode of the plurality of current sensor transistors, which are disposed on the same line, may be connected to each other across the insulation region.

In the power semiconductor device, a well region and a source region may be separately disposed in the semiconductor layer of the main cell region and the sensor region, and the well region and the source region may not be disposed in the semiconductor layer of the insulation region and a drift region may extend in the semiconductor layer of the insulation region.

In the power semiconductor device, a current sensor terminal configured to function as an output terminal of the plurality of current sensor transistors may be disposed on the semiconductor layer outside the main cell region and the sensor region.

In another form of the present disclosure, a power semiconductor device includes: a kelvin emitter terminal and an emitter terminal, which are connected to an emitter electrode of a plurality of power semiconductor transistors disposed in a main cell region; a gate terminal connected to a gate electrode of the plurality of power semiconductor transistors; a current sensor terminal connected to a plurality of current sensor transistors disposed in a sensor region and configured to monitor a current of the plurality of current sensor transistors; and a protection resistance layer disposed on a semiconductor layer across an insulation region between the main cell region and the sensor region so that the emitter terminal and the current sensor terminal are connected to each other under an abnormal operation condition.

In the power semiconductor device, the protection resistance layer may be connected to each of a well region of at least a portion of the plurality of power semiconductor transistors and a well region of at least a portion of the plurality of current sensor transistors.

In the power semiconductor device, at least a portion of the plurality of power semiconductor transistors and at least a portion of the plurality of current sensor transistors may share a gate capacitance.

In the power semiconductor device, a gate electrode of the plurality of power semiconductor transistors and a gate electrode of the plurality of current sensor transistors may be arranged in a stripe type, and a gate electrode of the plurality of power semiconductor transistors and a gate electrode of the plurality of current sensor transistors, which are disposed on the same line, may be connected to each other across the insulation region.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Hereinafter, forms will be described in detail with reference to the accompanying drawings. The present disclosure may, however, be embodied in different forms and should not be construed as limited to the forms set forth herein. Rather, these forms are provided so that this disclosure will be thorough and complete, and will fully convey the scope of the present disclosure to those skilled in the art. Also, for convenience of description, the dimensions of elements are exaggerated or downscaled.

Unless otherwise defined, all terms (including technical and scientific terms) used herein have the same meaning as generally understood by those skilled in the art. In the figures, the dimensions of layers and regions are exaggerated for clarity of illustration. In the drawings, like reference numerals refer to like elements throughout. It will also be understood that when a component such as a layer or a region is referred to as being "on" another component, it can be directly on the other component, or intervening components may also be present. On the other hand, it will also be understood that when a component is referred to as being 'directly on' another component, intervening components may not be present.

Figure 1:
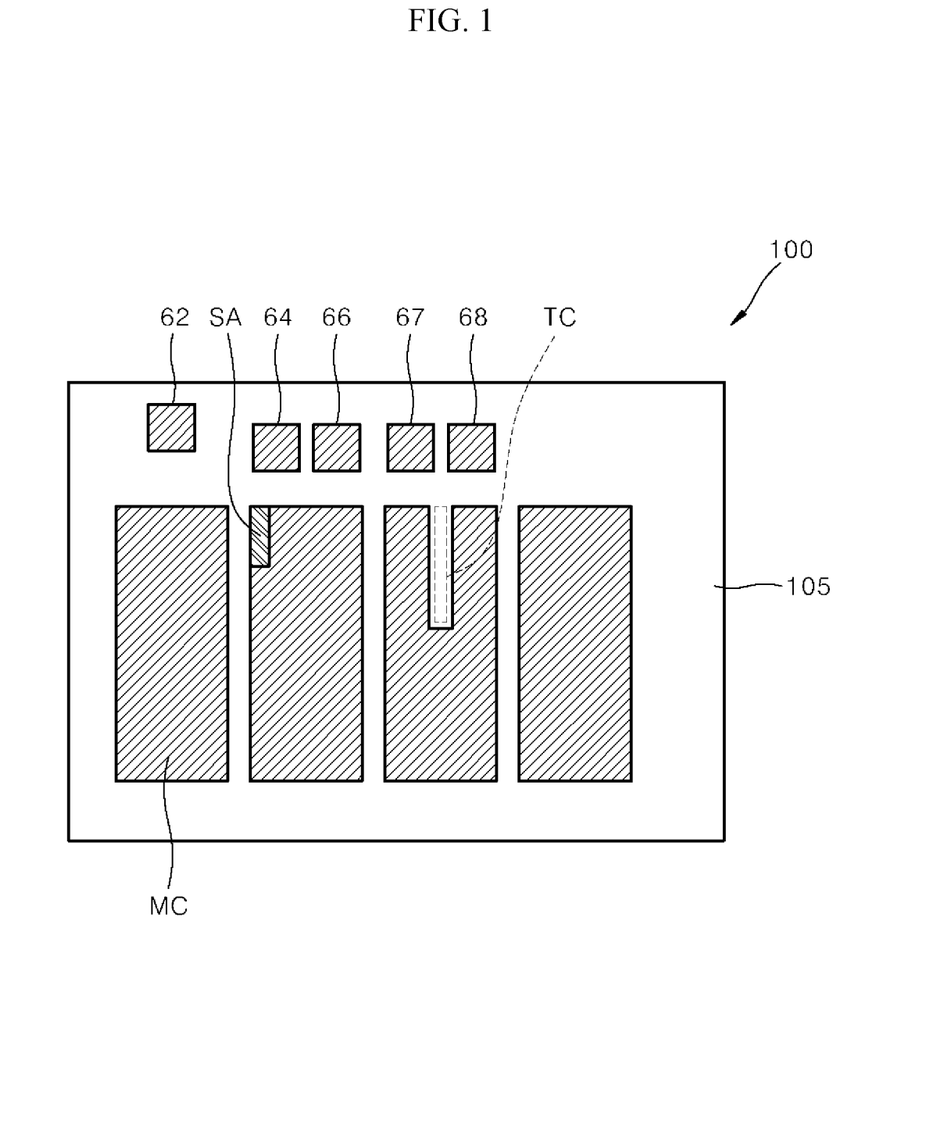
FIG. 1 is a schematic plan view illustrating a power semiconductor device according to one form of the present disclosure.
Figure 2:
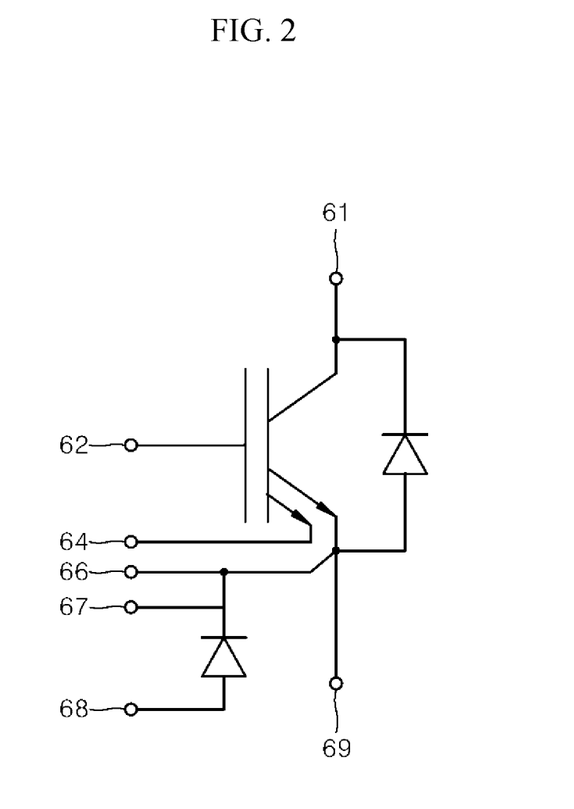
FIG. 2 is a circuit diagram illustrating the power semiconductor device according to one form of the present disclosure.
Figure 3:
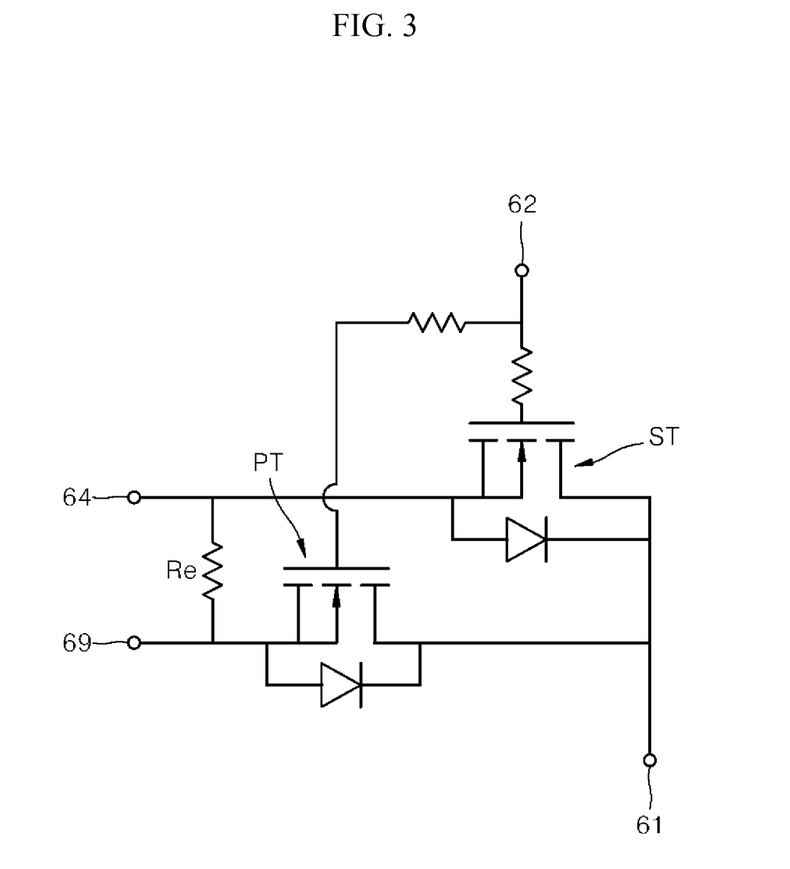
FIG. 3 is a circuit diagram illustrating a portion of the power semiconductor device of FIG. 2.

FIG. 1 is a schematic plan view illustrating a power semiconductor device 100 according to one form of the present disclosure, FIG. 2 is a circuit diagram illustrating the power semiconductor device 100 according to one form of the present disclosure, and FIG. 3 is a circuit diagram illustrating a portion of the power semiconductor device 100 of FIG. 2.

Referring to FIG. 1, the power semiconductor device 100 may be realized by using a semiconductor layer 105 including a main cell region MC and a sensor region SA. The power semiconductor device 100 may include a wafer, chip, or die structure.

For example, a plurality of power semiconductor transistors (PT of FIG. 3) may be disposed in the main cell region MC. For example, the power semiconductor transistors PT may include an insulated gate bipolar transistor (IGBT) or a power MOSFET. The IGBT may include a gate electrode, an emitter electrode, and a collector electrode. In FIGS. 2 to 3, the IGBT will be described as an example of the power semiconductor device 100.

Referring to FIGS. 1 to 3 together, the power semiconductor device 100 may include a plurality of terminals for external connection. For example, the power semiconductor device 100 may include: a kelvin emitter terminal 66 and an emitter terminal 69, which are connected to an emitter electrode of each of the power semiconductor transistors PT; a gate terminal 62 connected to a gate terminal of each of the power semiconductor transistors PT; a current sensor terminal 64 connected to current sensor transistors ST for monitoring a current; temperature sensor terminals 67 and 68 connected to a temperature sensor TC for monitoring a temperature; and/or a collector terminal connected to a collector electrode of each of the current sensor transistors ST and the power semiconductor transistors PT. In FIG. 2, the collector terminal 61 is disposed on a rear surface of the power semiconductor device 100 of FIG. 1.

The temperature sensor TC may include a junction diode connected to the temperature sensor terminals 67 and 68. The junction diode may include a junction structure of at least one n-type impurity region and at least one p-type impurity region, e.g., a P-N junction structure, a P-N-P junction structure, and an N-P-N junction structure. Although a structure of the power semiconductor device 100 including the temperature sensor TC therein is exemplarily described in the form, the temperature sensor TC may be omitted in a modified example of the form.

The power semiconductor transistors PT is connected between the emitter terminal 69 and the collector terminal 61, and the current sensor transistor ST is connected to the power semiconductor transistor PT with a partial parallel connection between the current sensor terminal 64 and the collector terminal 61. A gate electrode of the current sensor transistors ST and a gate electrode of the power semiconductor transistors PT are connected in common to the gate terminal 62 by providing a predetermined resistor therebetween.

The current sensor transistors ST may have substantially the same structure as the power semiconductor transistors PT. Here, the current sensor transistors ST may be reduced by a predetermined ratio from the power semiconductor transistors PT. Thus, as an output current of the current sensor transistors ST is monitored, an output current of the power semiconductor transistors PT may be indirectly monitored.

In this form, the emitter terminal 69 and the current sensor terminal 64 may be connected through a predetermined protection resistor Re. The protection resistor Re may be an insulation resistor that is large enough to insulate between the emitter terminal 69 and the current sensor terminal 64 so that a current substantially does not flow during a normal operation of the power semiconductor device 100. Here, a feature of connecting the emitter terminal 69 and the current sensor terminal 64 through the protection resistor Re may represent an electrical connection allowing a current flow under an abnormal operation condition, e.g., an electrostatic discharge (ESD) condition.

Thus, a current or electron flow through the emitter terminal 69 of the power semiconductor transistors PT is distinguished from a current or electron flow through the current sensor terminal 64 of the current sensor transistors ST under a normal operation condition. However, under the abnormal operation condition, e.g., the ESD condition, as an extremely large voltage is applied or an extremely large current is introduced, the current or electron flow of the current sensor transistors ST may be distributed in a direction toward the power semiconductor transistors PT through the protection resistor Re. Thus, a capacitance may increase, and a capacitance characteristic may improve even in the sensor region SA having a relatively smaller size than the main cell region MC. That is, the sensor region SA may be protected from an ESD shock by using the current distribution through the protection resistor Re.

Figure 4:
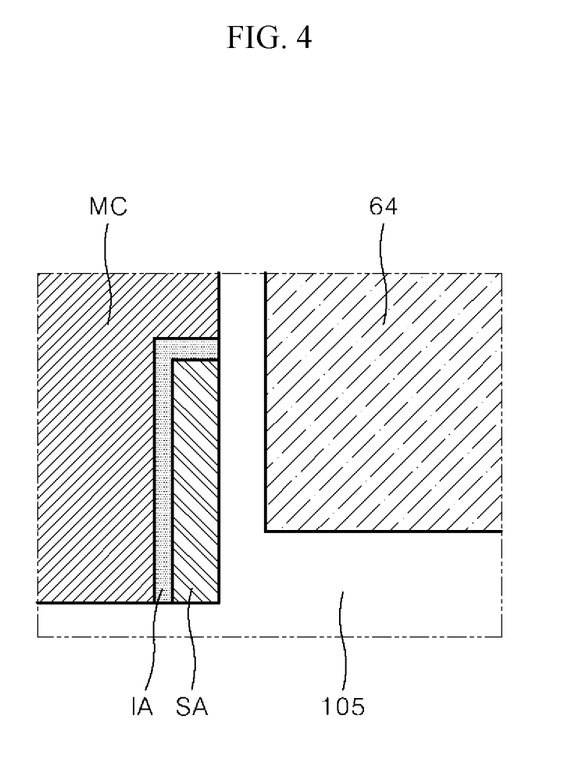
FIG. 4 is a schematic plan view illustrating a partial region of the power semiconductor device according to one form of the present disclosure.

FIG. 4 is a schematic plan view illustrating a partial region of the power semiconductor device according to one form of the present disclosure.

Referring to FIG. 4, a semiconductor layer 105 may include the main cell region MC, the sensor region SA, and an insulation region IA disposed between the main cell region MC and the sensor region SA. Furthermore, the semiconductor layer 105 may further include a terminal region for forming terminals functioning as an external output terminal.

In this form, the power semiconductor transistors PT are disposed in the main cell region MC, and the current sensor transistors ST are disposed in the sensor region SA. The sensor region SA may be disposed at the semiconductor layer 105 outside the sensor region SA instead of being disposed below the current sensor terminal 64. Thus, the current sensor terminal 64, which functions as an output terminal of the current sensor transistors ST, may be disposed in a separate terminal region unlike a typical case, e.g., the semiconductor layer 105 outside the main cell region MC and the sensor region SA. In this case, a size of the current sensor terminal 64 may be adjusted regardless of a size of the sensor region SA.

In some forms of the present disclosure, the sensor region SA may be formed by converting a partial region of the main cell region MC. In this case, the insulation region IA may be disposed between the main cell region MC and the sensor region SA to electrically insulate the main cell region MC and the sensor region SA during the normal operation condition. Thus, the insulation region IA may be disposed to surround at least a portion of the sensor region SA. As described above, the protection resistor Re may be disposed in the insulation region IA.

Figure 5:
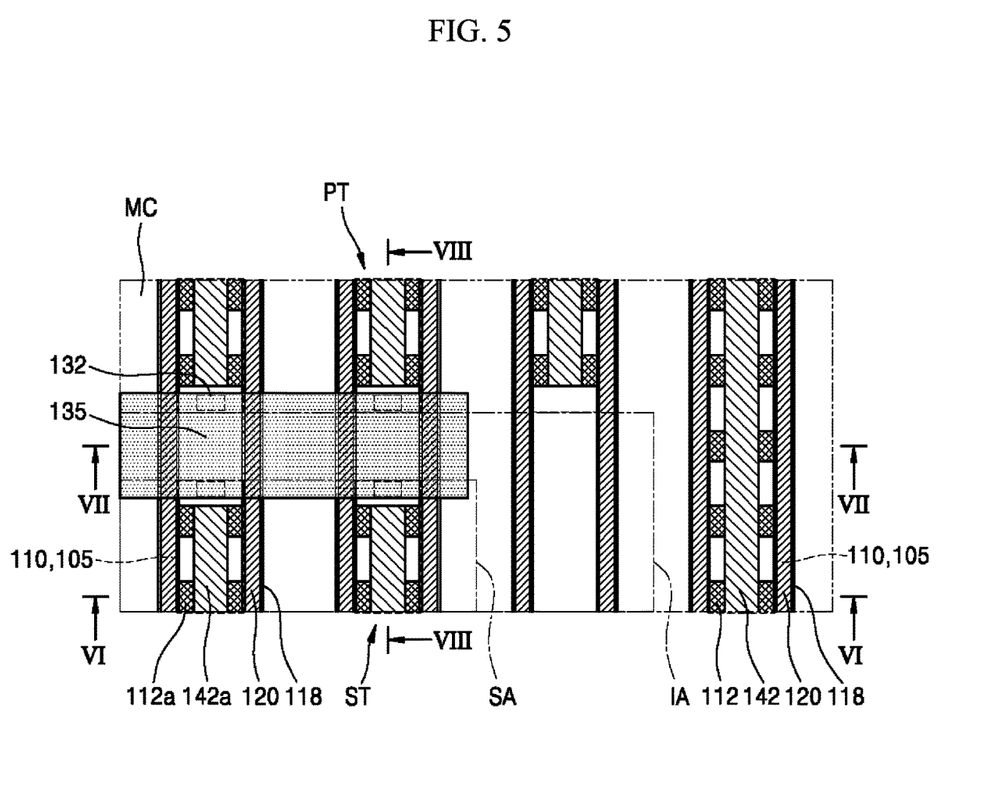
FIG. 5 is a schematic plan view illustrating a portion of a main cell region and a sensor region of FIG. 4.
Figure 6:
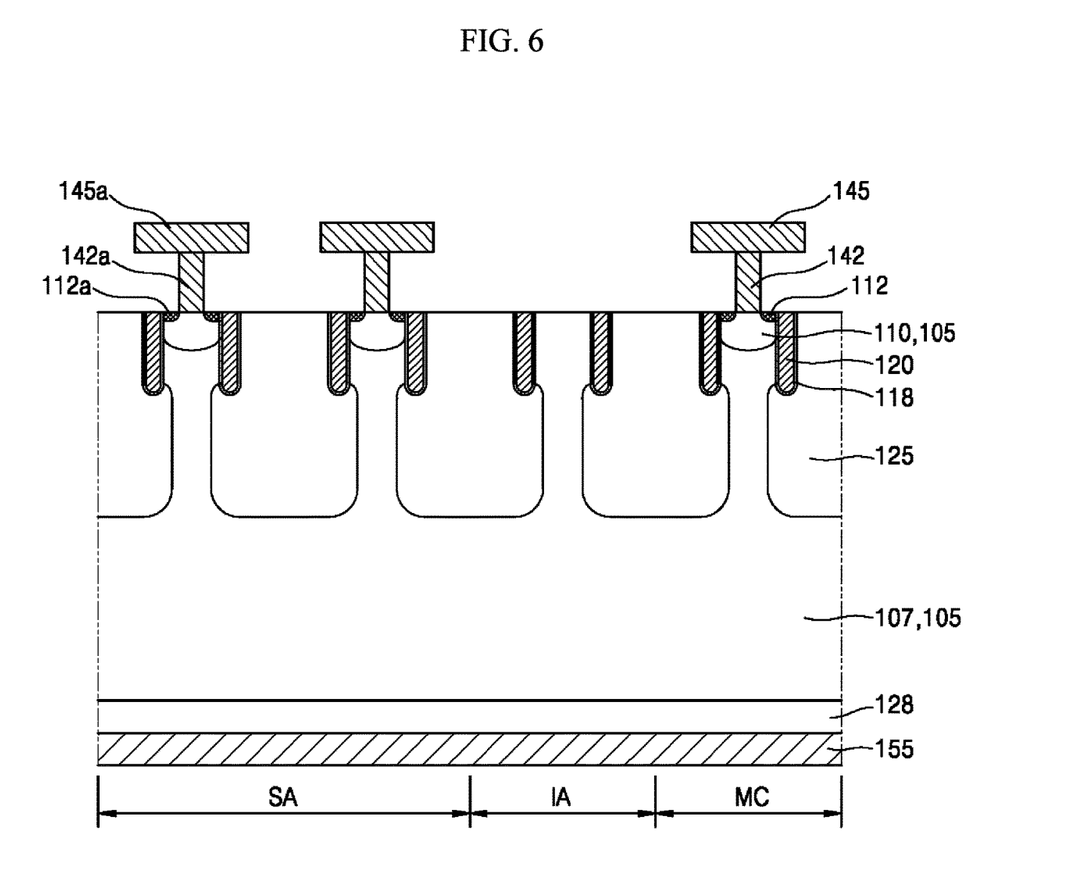
FIG. 6 is a cross-sectional view taken along line VI-VI of FIG. 5.
Figure 7:
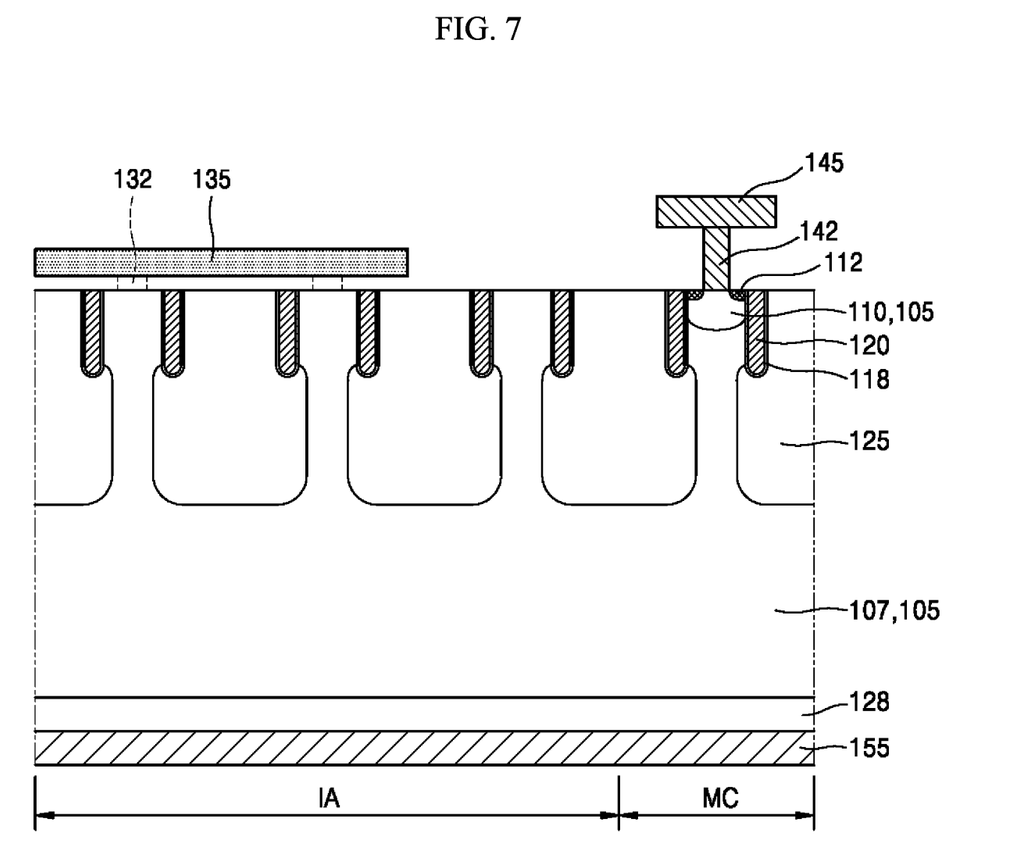
FIG. 7 is a cross-sectional view taken along line VII-VII of FIG. 5.
Figure 8:
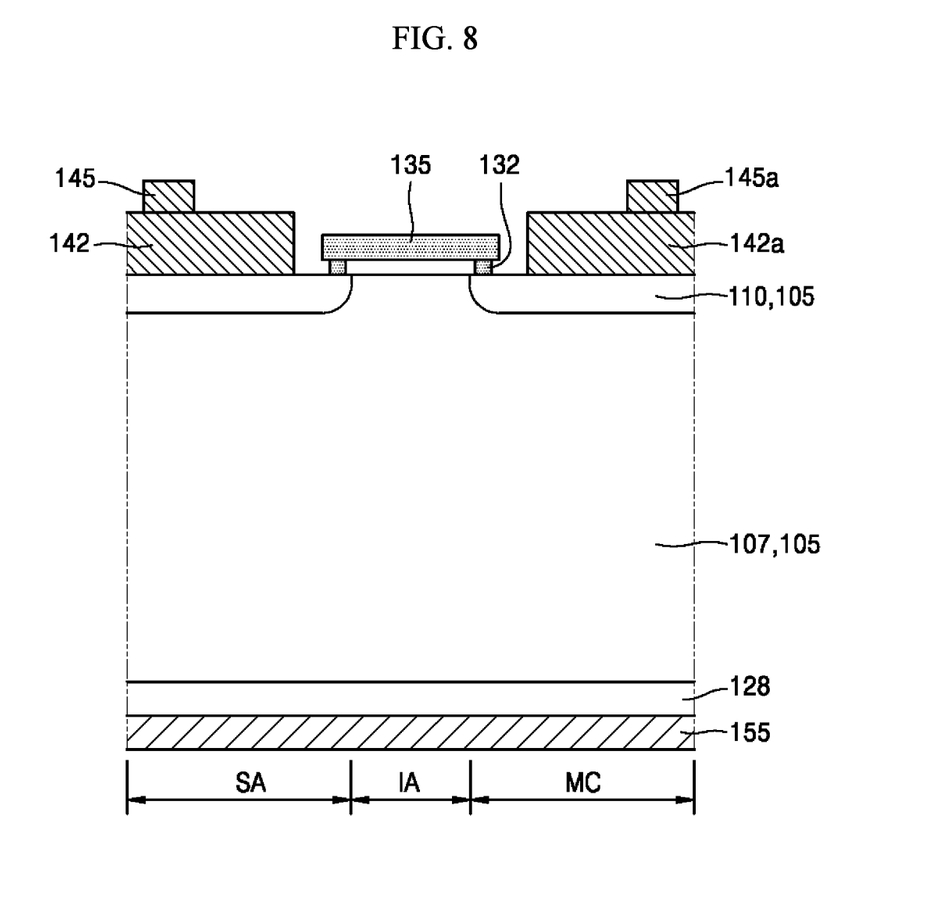
FIG. 8 is a cross-sectional view taken along line VIII-VIII of FIG. 5.

FIG. 5 is a schematic plan view illustrating a portion of the main cell region and the sensor region. FIG. 6 is a cross-sectional view taken along line VI-VI of FIG. 5, FIG. 7 is a cross-sectional view taken along line VII-VII of FIG. 5, and FIG. 8 is a cross-sectional view taken along line VIII-VIII of FIG. 5.

Referring to FIGS. 5 to 8, the power semiconductor transistors PT and the current sensor transistors ST may be disposed at the semiconductor layer 105.

The semiconductor layer 105 may refer to one or a plurality of semiconductor material layer, e.g., a portion of a semiconductor substrate and/or one or a plurality of epitaxial layers. For example, the semiconductor layer 105 may include a drift region 107 and a well region 110.

In the main cell region MC, the semiconductor layer 105 may further include a source region 112 in the well region 110. Here, the source region 112 may be referred as an emitter region. Hereinafter, the source region 112 may be referred to as a source region or an emitter region.

Furthermore, the semiconductor layer 105 may further include a floating region 125 disposed between and below the gate electrodes 120.

Each of the drift region 107 and the source region 112 may have a first conductive type, and each of the well region 110 and the floating region 125 may have a second conductive type. The first conductive type and the second conductive type may have conductive types opposite to each other, and each of the first conductive type and the second conductive type may be one of an n-type and a p-type. For example, when the first conductive type is the n-type, the second conductive type may be the p-type, and the opposite may be also true.

The drift region 107 may be formed as a first conductive type epitaxial layer, and the well region 110 may be formed by doping a second conductive type impurity to the epitaxial layer or formed as a second conductive type epitaxial layer. The source region 112 may be formed by doping a first conductive type impurity in the well region 110 or additionally forming the first conductive type epitaxial layer.

A collector region 128 may be provided below the drift region 107, and a collector electrode 155 may be provided below the collector region 128 so as to be connected to the collector region 128. For example, the drift region 107 may be provided on a semiconductor substrate (not shown), the semiconductor substrate may delimit at least a portion or whole of the second conductive type collector region 128, and the collector electrode 155 may be provided on a bottom surface of the semiconductor substrate. For another example, the collector region 128 may be provided as a second conductive type epitaxial layer below the drift region 107.

A gate electrode 120 may be recessed into the semiconductor layer 105 to bury at least one trench formed in the semiconductor layer 105. The trench may be formed with a predetermined depth from a surface of the semiconductor layer 105. For example, the trench may pass through the source region 112 and the well region 110 and extend until a portion of the drift region 107. The trench may have a rounded corner to restrict an electric field from being concentrated. For example, a lower end corner of the trench may be round-processed.

A gate insulation layer 118 may be disposed between the gate electrode 120 and the semiconductor layer 105 in the trench. An insulation layer 130 may be disposed on the gate electrode 120. One or a plurality of gate electrodes 120 may be provided. The number of the gate electrodes 120 may be appropriately selected according to a desired operation specification. However, the form of the present disclosure is not limited thereto.

Furthermore, a cell contact electrode 142 may be disposed on the emitter region or the source region 112. Single-layer or multilayer wire electrode 145 may be disposed on the cell contact electrode 142. An interlayer insulation layer (not shown) may be additionally provided between the semiconductor layer 105 and the wire electrode 145.

A structure of one current sensor transistor ST in the sensor region SA may be substantially the same as that of one power semiconductor transistor PT in the main cell region MC. For example, in the sensor region SA and the main cell region MC, the drift region 107, the floating region 125, and the gate electrode 120 may be continuously formed instead of being distinguished.

However, the well region 110 may be separately formed in the sensor region SA and the main cell region MC. The drift region 107 may extend to the insulation region IA between the sensor region SA and the main cell region MC instead of forming the well region and the source region. Thus, a P-N diode structure may be formed between the well region 110 of the sensor region SA and the drift region 107 of the insulation region IA and between the well region 110 of the main cell region MC and the drift region 107 of the insulation region IA.

Furthermore, the emitter region or the source region 112a in the sensor region SA may be formed in the well region 110 so as to be separated from the emitter region or the source region 112 in the main cell region MC. Also, the cell contact electrode 142a may be disposed on the emitter region or the source region 112a, and the single-layer or multilayer wire electrode 145a may be disposed on the cell contact electrode 142a.

In this form, at least a portion of the power semiconductor transistors PT and at least a portion of the current sensor transistors ST may be connected to each other under the abnormal operation condition by providing the protection resistor Re disposed in the insulation region IA therebetween. For example, at least a portion of the power semiconductor transistors PT and at least a portion of the current sensor transistors ST may be connected to each other through a protection resistance layer 135 disposed on the semiconductor layer 105 across the insulation region IA under the abnormal operation condition. In this case, the protection resistor Re may include the protection resistance layer 135.

For example, the protection resistance layer 135 may be connected to each of the well region 110 of at least a portion of the power semiconductor transistors PT and the well region 110 of at least a portion of the current sensor transistors ST. For example, the protection resistance layer 135 may include a contact resistance layer 132, and in this case, the protection resistance layer 135 may be connected to the well region 110 through the contact resistance layer 132.

The protection resistance layer 135 and the contact resistance layer 132 may be made of the same material as or different materials from each other. For example, the protection resistance layer 135 and the contact resistance layer 132 may include a polysilicon layer doped with a predetermined concentration, and in this case, the protection resistance layer 135 and the contact resistance layer 132 may not be distinguished from each other.

Since the protection resistance layer 135 has a relatively higher resistance than the source region 112, a current flow through the protection resistor Re may be insignificant under the normal operation condition. Thus, the protection resistance layer 135 may include polysilicon having an adjusted doping concentration so that the protection resistance layer 135 allows almost no current flow under the normal operation condition of the power semiconductor device 100 because of a high resistance thereof, but allows the current flow under the abnormal operation condition, e.g., the ESD condition.

In this form, since the protection resistance layer 135 is formed separately from the well region 110, the resistance thereof may be adjusted by separately setting the doping concentration according to a current amount required under the abnormal operation condition.

In some forms, at least a portion of the power semiconductor transistors PT and at least a portion of the current sensor transistors ST may share a gate capacitance. For example, at least a portion of the power semiconductor transistors PT and at least a portion of the current sensor transistors ST may share the gate electrode 120.

More particularly, the gate electrode 120 of the power semiconductor transistors PT and the gate electrode 120 of the current sensor transistors ST may be arranged in a stripe type as illustrated in FIG. 5. In this case, the gate electrode 120 of the power semiconductor transistors PT and the gate electrode 120 of the current sensor transistors ST, which are disposed on the same line, may cross the insulation region IA and be connected to each other. In this case, the power semiconductor transistors PT of the main cell region MC and the current sensor transistors ST of the sensor region SA may share the gate capacitance. Thus, an effect of substantially increasing the capacitance of the sensor region SA may be obtained.

In a modified example of the form, the gate electrode 120 may be separated in the sensor region SA and the main cell region MC instead of being shared. In this case, although the gate capacitance is not shared in the sensor region SA and the main cell region MC, current distribution through the protection resistor Re is still possible under the ESD condition.

According to the form, the structure may be simplified by allocating a partial region of the typical main cell region MC to the sensor region SA. In this case, the well region 110, the drift region 107, the gate electrode 120, etc., in the main cell region MC, the sensor region SA, and the insulation region IS may be manufactured through a batch process.

Although the above description is described in case when the power semiconductor device is the IGBT, this may be directly applied to a power MOSFET. For example, in the power MOSFET, the collector region 128 may not be provided, and a drain electrode may be provided instead of the collector electrode.

In the power semiconductor device according to some forms of the present disclosure, as the sensor region and the main cell region are connected by providing the protection resistance layer therebetween under the abnormal operation condition, the capacitance characteristic of the sensor region may improve. The above-described effect is merely illustrative, and the forms of the present disclosure are not limited to the effect.

Although the exemplary forms of the present disclosure have been described, it is understood that the present disclosure should not be limited to these forms but various changes and modifications can be made by one ordinary skilled in the art within the spirit and scope of the present disclosure. Hence, the real protective scope of the present disclosure shall be determined by the technical scope of the accompanying claims.

What is claimed is:
1. A power semiconductor device comprising:
  a semiconductor layer comprising a main cell region, a sensor region, and an insulation region between the main cell region and the sensor region;
  a plurality of power semiconductor transistors disposed on the main cell region;
  a plurality of current sensor transistors disposed on the sensor region; and
  a protection resistance layer disposed on the semiconductor layer across the insulation region so that at least a portion of the plurality of power semiconductor transistors and at least a portion of the plurality of current sensor transistors are connected to each other under an abnormal operation condition, wherein the protection resistance layer is disposed spaced apart from the semiconductor layer by a predetermined distance and extends parallel to a surface of the semiconductor layer, wherein the protection resistance layer is connected to each of a well region of the at least a portion of the plurality of power semiconductor transistors and a well region of the at least a portion of the plurality of current sensor transistors, wherein the well region of at least the portion of the plurality of power semiconductor transistors is in contact with a source region of the plurality of power semiconductor transistors, wherein the well region of at least the portion of the plurality of current sensor transistors is in contact with a source region of the plurality of current sensor transistors.

2. The power semiconductor device of claim 1, wherein the protection resistance layer comprises a polysilicon layer having an adjusted doping concentration.

3. The power semiconductor device of claim 1, wherein the at least a portion of the plurality of power semiconductor transistors and the at least a portion of the plurality of current sensor transistors share a gate capacitance.

4. The power semiconductor device of claim 3, wherein the at least a portion of the plurality of power semiconductor transistors and the at least a portion of the plurality of current sensor transistors share a gate electrode.

5. The power semiconductor device of claim 1, wherein:
a gate electrode of the plurality of power semiconductor transistors and a gate electrode of the plurality of current sensor transistors are arranged in a stripe type, and the gate electrode of the plurality of power semiconductor transistors and the gate electrode of the plurality of current sensor transistors, which are disposed on the same line, are connected to each other across the insulation region.

6. The power semiconductor device of claim 1, wherein:
the well region and the source region are separately disposed in the semiconductor layer of the main cell region and the sensor region, and the well region and the source region are not disposed in the semiconductor layer of the insulation region and a drift region is configured to extend in the semiconductor layer of the insulation region.

7. The power semiconductor device of claim 1, wherein a current sensor terminal configured to function as an output terminal of the plurality of current sensor transistors is disposed on the semiconductor layer outside the main cell region and the sensor region.

8. A power semiconductor device comprising:
a kelvin emitter terminal and an emitter terminal, which are connected to an emitter electrode of a plurality of power semiconductor transistors disposed in a main cell region;

a gate terminal connected to a gate electrode of the plurality of power semiconductor transistors;

a current sensor terminal connected to a plurality of current sensor transistors disposed in a sensor region and configured to monitor a current of the plurality of current sensor transistors; and a protection resistance layer disposed on a semiconductor layer across an insulation region between the main cell region and the sensor region so that the emitter terminal and the current sensor terminal are connected to each other under an abnormal operation condition, wherein the protection resistance layer is disposed spaced apart from the semiconductor layer by a predetermined distance and extends parallel to a surface of the semiconductor layer, wherein the protection resistance layer is connected to each of a well region of at least a portion of the plurality of power semiconductor transistors and a well region of at least a portion of the plurality of current sensor transistors, wherein the well region of the at least a portion of the plurality of power semiconductor transistors is in contact with an emitter region of the plurality of power semiconductor transistors, wherein the well region of the at least a portion of the plurality of current sensor transistors is in contact with an emitter region of the plurality of current sensor transistors.

9. The power semiconductor device of claim 8, wherein the at least a portion of the plurality of power semiconductor transistors and the at least a portion of the plurality of current sensor transistors share a gate capacitance.

10. The power semiconductor device of claim 8, wherein:
a gate electrode of the plurality of power semiconductor transistors and a gate electrode of the plurality of current sensor transistors are arranged in a stripe type, and the gate electrode of the plurality of power semiconductor transistors and the gate electrode of the plurality of current sensor transistors, which are disposed on the same line, are connected to each other across the insulation region.

* * * * *